Patented Apr. 27, 1954 2,676,886

UNITED STATES PATENT OFFICE 2,676,886

METHOD OF PRODUCING PRINTING PLATES

Robert Barbarite, Brooklyn, N. Y., assignor to The United States Printing and Lithograph Company, Mineola, N. Y., a corporation of Ohio No Drawing. Application August 31, 1950, Serial No. 182,625

3 Claims. (Cl. 95—5.4)

The present invention more particularly relates to a method of preparing or producing a printing plate for use in planographic, rotary, offset printing in which the plate comprises a base of aluminum, or zinc, or alloys of these metals, on which is deposited a firmly adhering hydrophobic metal, preferably copper.

It is well known in the printing industry that printing plates, generally speaking, comprise metallic areas having little affinity for grease and other areas having high affinity for grease. Aluminum, zinc and alloys of these metals are hydrophilic, having little affinity for grease, while copper is hydrophobic, having high affinity for grease. Hence, the copper serves to carry the ink in the printing process while the aluminum or zinc and like metals transfer no ink to the printing paper. There are several methods whereby printing plates may be formed, such as by electrodeposition, molten metal spray and chemical, the latter involving metal displacement wherein copper is deposited on the surface of the base metal to form an alloy with that metal or an extremely thin copper surface firmly bonded to the base metal. The present invention relates to the last named method which has advantages over the electrolytic or spray methods chiefly in its simplicity and economy. Expensive plating equipment need not be installed nor is there required a tremendous background of experience and skill. The chemical method has the further advantage in that corrections or "set ins" in the finished plate may be readily made.

Heretofore, printing plates have been produced in which the base plate is formed of aluminum, zinc, or similar metals and alloys, in which the hydrophobic metal deposited thereon comprises sulfides of copper and other metals which may be readily detected upon examination by its dark gray or black coloration. In these instances, the copper or other metallic compositions are readily removed by subjecting the plate, for example, to a lye solution or to abrasion. Such compositions do not have high affinity for the base plate, nor does the composite plate have long life, as compared to the plate of the present invention.

It is the principal object of the present invention to provide a method for preparing or producing printing plates which is relatively inexpensive to carry out and requires but a relatively short time in fabricating such plates, and wherein the finished plate is characterized by its extremely long life due to its wear-resisting properties and the clarity, sharpness and good fidelity of the pictures printed thereby.

A further object resides in providing a method of the foregoing character which will produce a printing plate having a substantially pure copper deposition firmly adhering to the base plate, the chemically deposited copper being thin but of a thickness comparable to the copper surface ordinarily deposited on electrolytically prepared plates, and the process requiring but a relatively short time for the preparation of such printing plates while the thickness of the copper image layer so produced within such short period of time characterizing the plate with extremely long life, much longer than presently known commercial printing plates.

The preferred process of the present invention, briefly comprises providing a chemical deposition of substantially pure copper upon the image-bearing areas of an aluminum or zinc plate, including alloys thereof, by developing an image-bearing area through the use of a solution comprising an alcohol soluble copper salt, an alcohol, an acid and water to thereby produce a bright, copper colored image area of substantially pure copper which copper layer is firmly bonded to the aluminum or zinc base plate.

In the following description of a preferred process of this invention, reference will be made to an aluminum base plate but it is to be understood that the plate may be of zinc or other similar suitable metals or alloys thereof. The base plate is preferably first grained to increase the surface area of the plate and consequently the water carrying ability of the non-image areas of the plate. Thereafter, the aluminum plate is preferably treated with a pre-etching solution which may be of the following composition:

30 ccs. glacial acetic acid.
120 ccs. phosphoric acid (85%).
100 grams ammonium dihydrogen phosphate.
30 ccs. gum arabic solution (15° Bé.).

Thereafter, the aluminum plate is coated with a light-sensitive colloid which for extremely good results contains a salt that is highly soluble in both alcohol and water but forms a highly insoluble salt with copper. Examples of such salts are potassium iodide and ammonium thiocyanate. The addition of such a salt to the gum coating solution inhibits any tendency of the copper to deposit through the light-hardened stencil on to the non-image areas of the base plate. An example of such a light sensitive colloid which includes the highly preferred deposit-inhibiting salt is as follows:

1000 ccs. gum arabic solution (14° Bé.).
340 ccs. ammonium dichromate solution (14.2° Bé.).
100 grams potassium iodide.
50 ccs. ammonium hydroxide (28%).

After the plate bearing the light sensitive colloid has been dried, as for example by whirling, it is exposed to the picture to be reproduced thereby in the usual photographic manner. It is then developed using a developing solution which for example, may consist of 950 cc. of calcium chloride solution (Bé. 40–41°) and 50 ccs. lactic acid (85%). The developed or image area will subsequently be the ink carrying or transfer area of the finished plate and this area is then preferably etched with an etching solution which, for example, may comprise:

2630 ccs. calcium chloride solution (40–41° Bé.).
1000 grams zinc chloride (technical).
750 ccs. iron perchloride solution (50–51° Bé.).
37 ccs. hydrochloric acid (37–38%).

Thereafter, the excess etching solution is squeegeed off, or otherwise removed, and the plate cleaned of any remaining metal salts or foreign matter as, for example, with anhydrous alcohol, ethyl or isopropyl.

The plate is now in preferred condition for the deposition of substantially pure copper on the image areas thereof, or, a metal which has a position in the displacement series below that of the metal of the plates. This is accomplished by applying to the plate or by immersing the plate in a solution which preferably comprises:

3500 ccs. ethyl alcohol (anhydrous).
83 ccs. water.
125 ccs. hydrochloric acid (37%).
31.2 grams cupric chloride (pure).

Treatment of the plate with a copper solution of the foregoing character for a period of say two to five minutes will deposit an extremely well adherent, uniform layer of substantially pure bright copper on the image areas of the plate, while the solution will not attack the light-hardened stencil protecting the non-image areas. However, the copper so deposited will be of a thickness comparable to that obtained in electrolytic processes as herein-above set forth.

After the plate has been subjected to the copper solution, excess copper solution is removed from the plate, or squeegeed off, and the plate is washed with anhydrous alcohol, dried, treated with a suitable lacquer or other suitable grease receptive material, and the light-hardened colloid layer is then removed as for example by means of water. The plate is now ready for use in printing processes.

The copper salt employed in the copper solution may be any copper salt capable of forming a 1% solution of said salt in a 90% solution of alcohol. Cuprous chloride, cuprous sulfate, cupric chloride and cupric sulfate are examples of satisfactory salts of copper. The concentration of the copper salt may vary from 1% up to and including its solubility limit in a 90% solution of alcohol. The alcohol preferably employed is ethyl alcohol but it may have mixed therewith some propyl or isopropyl alcohol, and the acid may be any acid that will provide the necessary hydrogen ion. It is to be noted that etching before treatment with the copper solution is not essential but the rate of deposition of copper is increased if the metal is etched prior to treatment with the copper solution. This result is considered to be attributable to the fact that the etching step serves to remove the mono-molecular layer of aluminum oxide which is normally present in the case of an aluminum plate. Hence, the desirability of the etching step is somewhat dependent upon the character of the metal of the base plate with respect to its oxidizing properties.

Actual use of the plates formed in accordance with the process of the present invention have proven that these plates have extremely long useful lives and are capable of being employed successfully in runs of the order of a million. Furthermore, the quality of the prints resulting from printing processes using such plates is considerably improved over that resulting from the use of presently known commercial plates. Furthermore, it should be obvious from the foregoing that the present process is much simpler and considerably more economical than processes involving electrolytic or molten metal spray methods of forming bimetallic plates. The thickness of the copper image area, which is produced in such a relatively short interval of time, in the present process and its excellent bond to the base plate endow the entire plate with the desired property of high resistance to wear, hence resulting in long life plates, also plates which comprise aluminum or zinc base metals are much easier to handle than those embodying other base metals such as stainless steel and the like.

What is claimed is:

1. The method of producing printing plates for planographic, offset printing machines which comprises the steps of applying a light-sensitive colloid to the surface of an aluminum printing plate, said colloid containing an inhibiting agent comprising a substance selected from the group consisting of potassium iodide and ammonium thiocyanate for forming with copper a copper compound highly insoluble in both alcohol and water to thereby prevent the copper being deposited on said plate from penetrating said colloid, reproducing the desired picture on the sensitized surface, developing the surface to expose image-bearing areas on said plate, and depositing on the image-bearing areas of said plate an adherent, substantially pure layer of copper by subjecting said plate to an acidic, alcoholic salt solution of copper.

2. The method of producing printing plates for planographic, offset printing machines which comprises the steps of applying a light-sensitive colloid to the surface of an aluminum printing plate, said colloid containing an inhibiting agent comprising a substance selected from the group consisting of potassium iodide and ammonium thiocyanate for forming with copper a copper compound highly insoluble in both alcohol and water to thereby prevent the copper being deposited on said plate from penetrating said colloid, reproducing the desired picture on the sensitized surface, developing the surface to expose image-bearing areas on said plate, and depositing on the image-bearing areas of said plate an adherent, substantially pure layer of copper by subjecting said plate to an acidic, alcoholic salt solution of copper containing copper as the sole metal in said solution, said plate being subjected to said solution for an interval sufficient to build up a substantially pure copper layer of appreciable thickness that is readily discernible by the naked eye.

3. The method of producing printing plates for planographic, offset printing machines which comprises the steps of applying a light-sensitive colloid to the surface of a metallic printing plate, said colloid containing an inhibiting agent comprising a substance selected from the group consisting of potassium iodide and ammonium thiocyanate for forming with copper a copper compound highly insoluble in both alcohol and water to thereby prevent the copper being deposited on said plate from penetrating said colloid, reproducing the desired picture on the sensitized surface, developing the surface to expose image-bearing areas on said plate, and depositing on the image-bearing areas of said plate an adherent, substantially pure layer of copper by subjecting said plate to an acidic, alcoholic salt solution of copper.

References Cited in the file of this patent

UNITED STATES PATENTS

| Number | Name | Date |
|---|---|---|
| 2,429,107 | Petren | Oct. 14, 1947 |
| 2,437,005 | Schwarz | Mar. 2, 1948 |